(12) United States Patent
Lee et al.

(10) Patent No.: US 8,853,705 B2
(45) Date of Patent: Oct. 7, 2014

(54) IMAGE SENSOR INCLUDING GUARD RING AND NOISE BLOCKING AREA TO BLOCK NOISE AND METHOD OF MANUFACTURING THE SAME

(75) Inventors: Kyung Ho Lee, Bucheon-si (KR); Jung Chak Ahn, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 7 days.

(21) Appl. No.: 13/286,786

(22) Filed: Nov. 1, 2011

(65) Prior Publication Data

US 2012/0104534 A1    May 3, 2012

(30) Foreign Application Priority Data

Nov. 2, 2010    (KR) ........................ 10-2010-0108327

(51) Int. Cl.
*H01L 29/00*        (2006.01)
*H01L 27/146*       (2006.01)

(52) U.S. Cl.
CPC ........ *H01L 27/1464* (2013.01); *H01L 27/1463* (2013.01); *H01L 27/14687* (2013.01); *H01L 27/14632* (2013.01)

USPC ......................................................... 257/73

(58) Field of Classification Search
CPC ................ H01L 23/585; H01L 21/761; H01L 21/823481; H01L 2924/3011; H01L 21/765
USPC ......................................................... 438/73
See application file for complete search history.

(56) References Cited

FOREIGN PATENT DOCUMENTS

| JP | 06-021416 |   | 1/1994 |
|----|-----------|---|--------|
| JP | 07-245384 |   | 9/1995 |
| KR | 1020007003432 | * | 4/2001 |
| KR | 1020010030818 |   | 4/2001 |
| KR | 1020090129092 | * | 12/2009 |

* cited by examiner

*Primary Examiner* — Tony Tran
(74) *Attorney, Agent, or Firm* — Stanzione & Kim, LLP

(57) ABSTRACT

An image sensor including a deep guard ring and a noise blocking area and a method of manufacturing the same. The image sensor includes the deep guard ring and a deep P well surrounding the noise blocking area, thereby preventing crosstalk between adjacent pixels. In addition, an ion implantation layer is divided by the noise blocking area, so that substrate crosstalk is effectively eliminated.

4 Claims, 22 Drawing Sheets

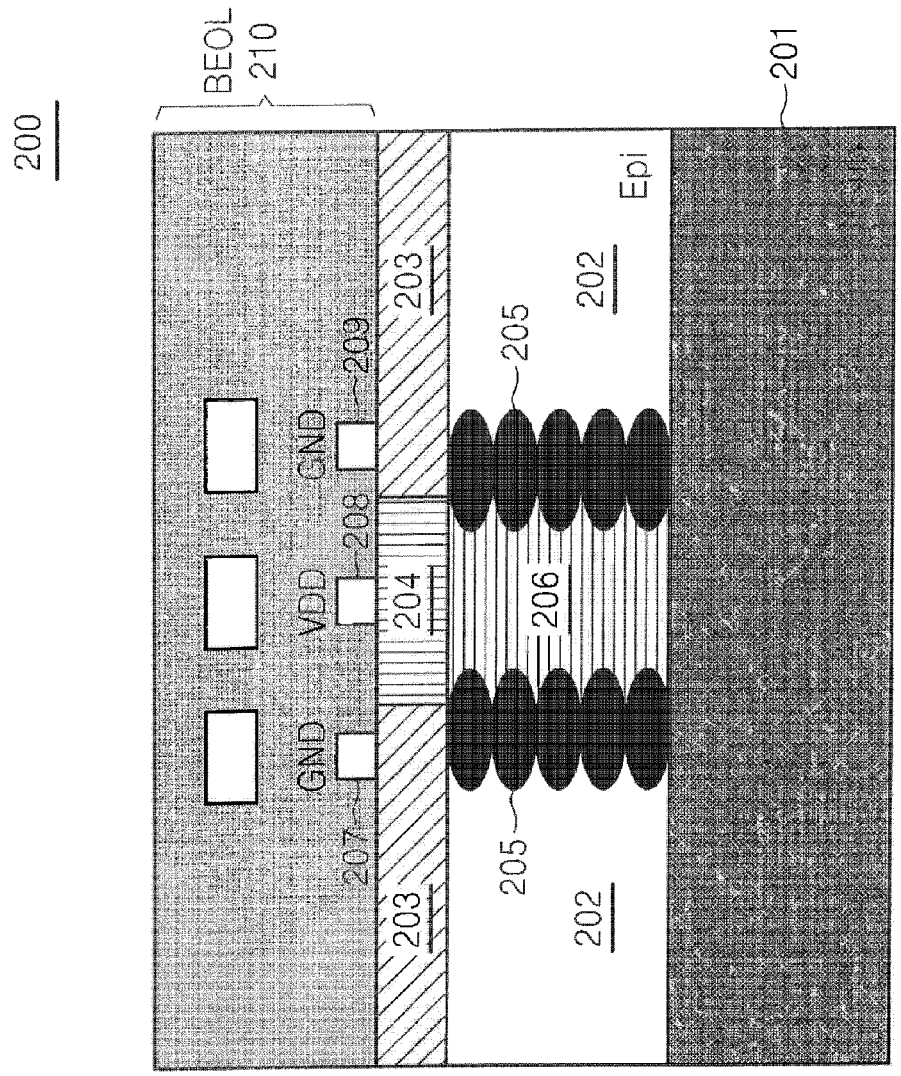

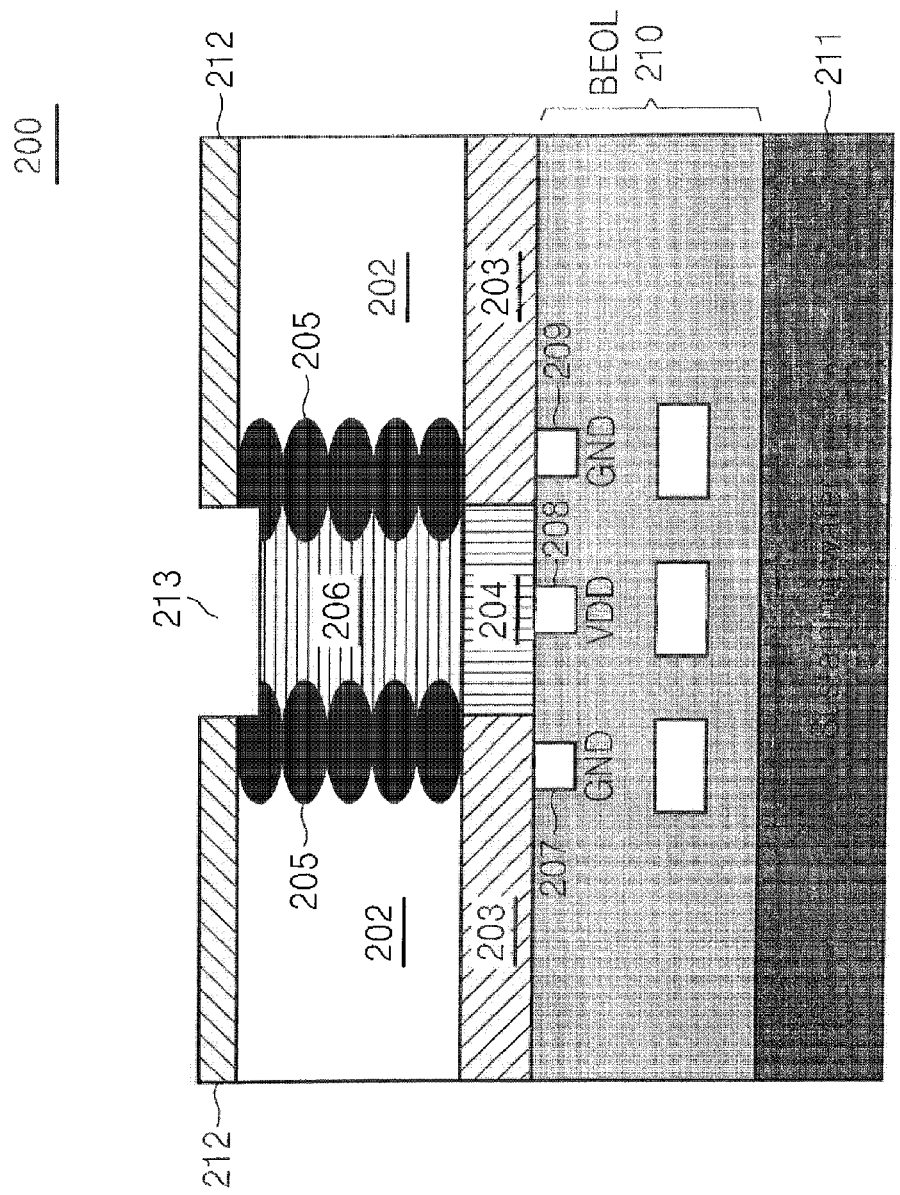

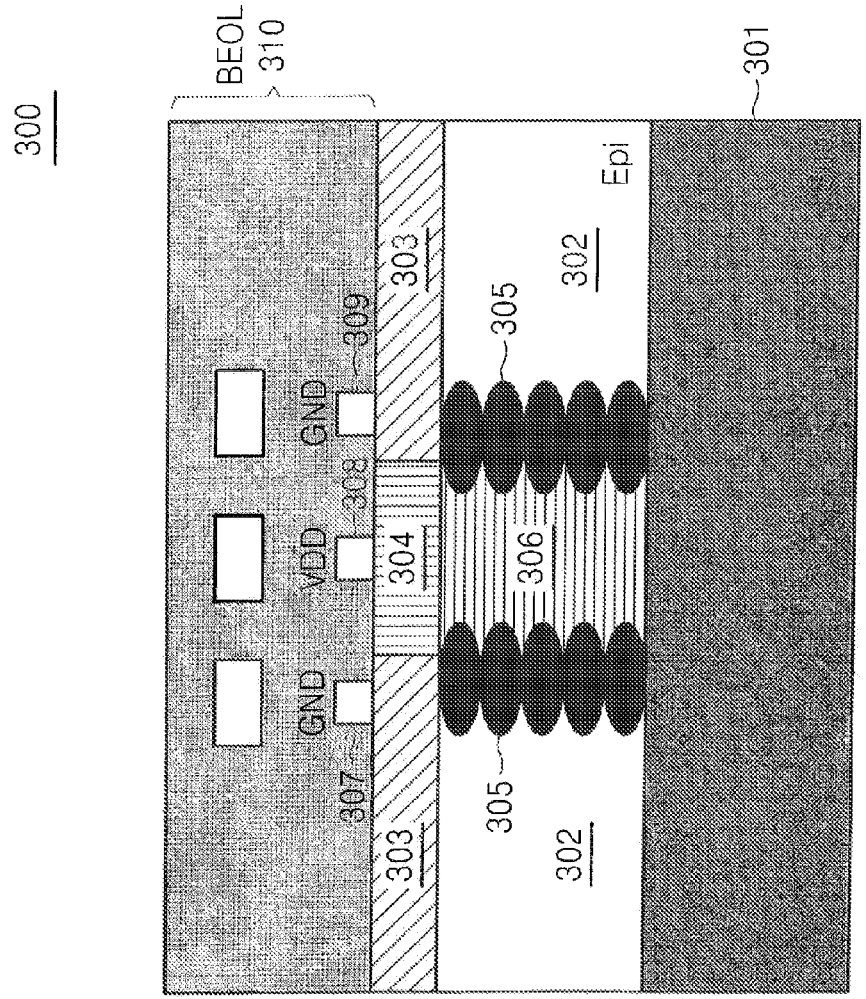

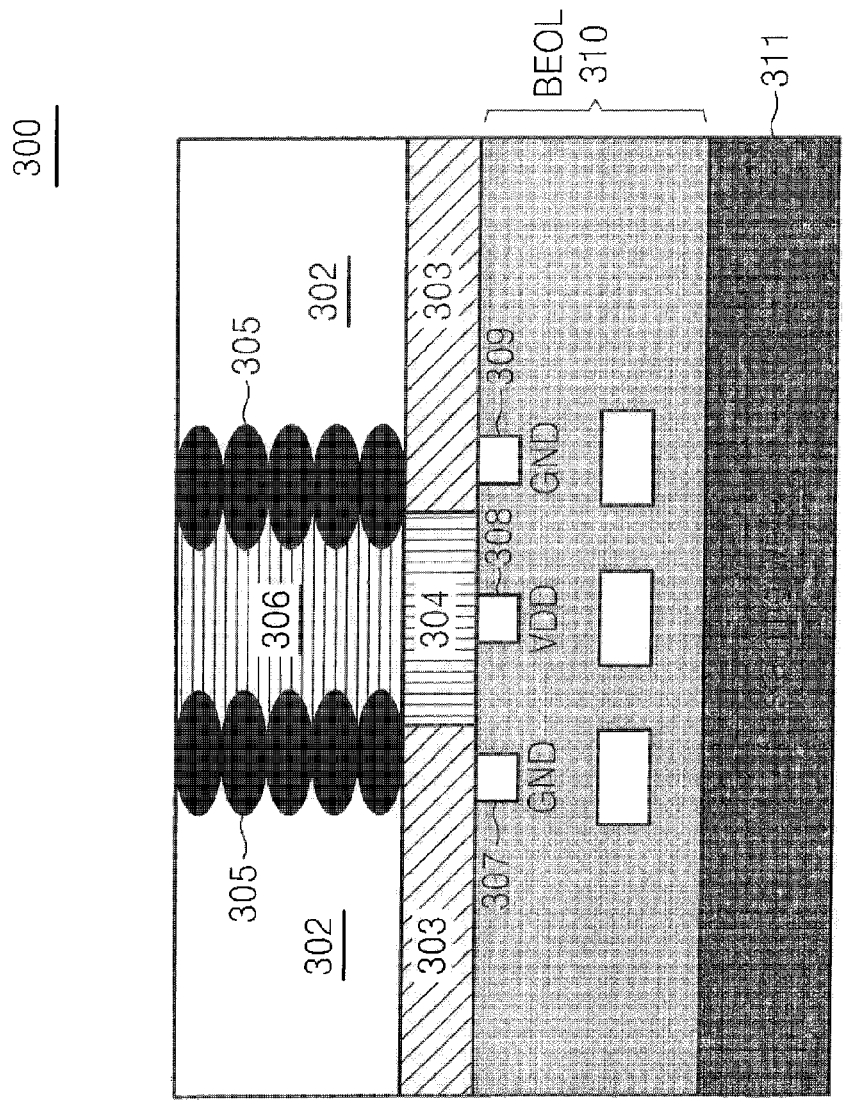

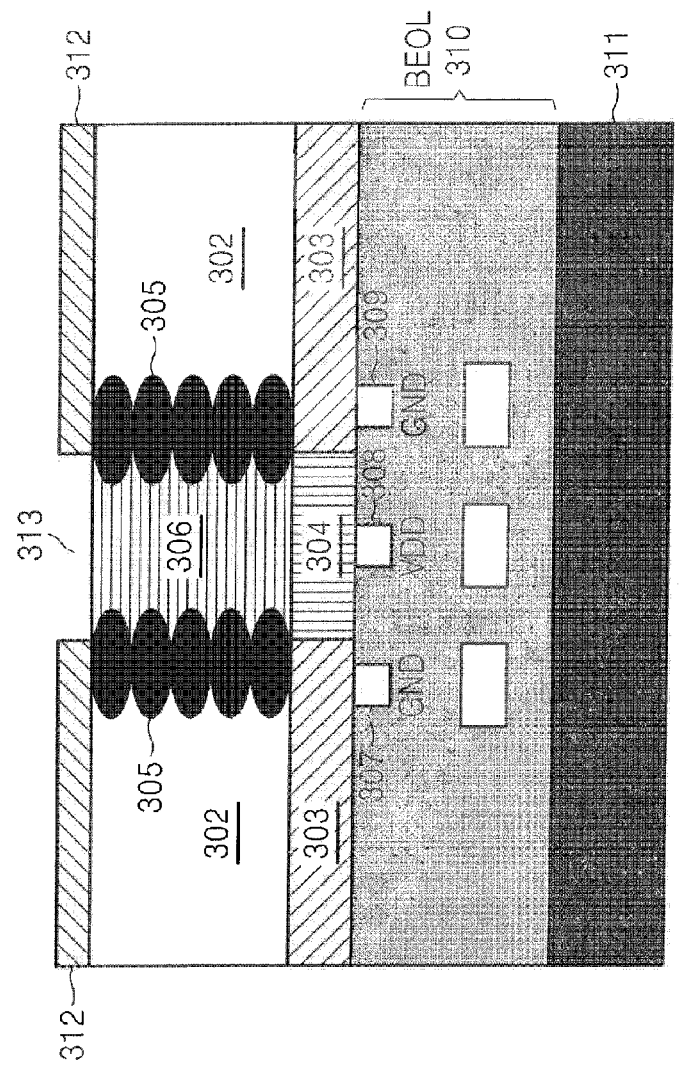

IMAGE SENSOR INCLUDING GUARD RING AND NOISE BLOCKING AREA TO BLOCK NOISE AND METHOD OF MANUFACTURING THE SAME

CROSS-REFERENCE TO RELATED APPLICATION

This application claims priority under 35 U.S.C. §119(a) from Korean Patent Application No. 10-2010-0108327 filed on Nov. 2, 2010, the disclosure of which is hereby incorporated by reference in its entirety.

BACKGROUND OF THE INVENTION

1. Field of the Invention

The present inventive concept relates to an image sensor, a display device and an image sensing system which include a guard ring, and more particularly, an image sensor, a display device and an image sensing system which include a deep guard ring and a noise blocking area to eliminate noise or crosstalk.

2. Description of the Related Art

With the development of information and telecommunication industries and the digitization of electronic devices, image sensors with improved performance are used in various fields such as digital cameras, camcorders, mobile phones, personal communication systems (PCSs), game machines, security cameras, and medical micro cameras.

Image sensors are semiconductor devices that convert an optical image into an electrical signal and are divided into charge coupled device (CCD) image sensors and complementary metal-oxide-semiconductor (CMOS) image sensors.

An image sensor includes a pixel array and analog and digital blocks which drives the pixel array and reads a signal from the pixel array. When the influence of substrate noise on a part of the analog block including the pixel array is decreased, the quality of picture can be increased. For instance, high-pixel sensors require high-speed framing and such a high-speed circuit operation may cause noise. Such noise may lead to dark random noise, horizontal line noise, and so on. In general, an important circuit block may be implemented by overlapping P/N or P/N/P/N or by a combination of deep N-well (DNW) and an N-well pickup. It is hard to apply the DNW to a pixel array. In addition, when the DNW is used, it is difficult to overcome crosstalk occurring through a P-substrate which is connected to each block and provides a ground.

However, in backside illumination sensors, a P-substrate is eliminated and a structure functioning as a thin P-substrate is formed by PIN ion-implantation on the backside. By forming such thin pinned photo diode (PPD) on the backside, substrate crosstalk noise can be effectively eliminated. In addition, a DNW process can be eliminated by forming a deep P/N guard ring using high-energy ion implantation.

SUMMARY OF THE INVENTION

Some embodiments of the present inventive concept provide an image sensor including a deep photodiode guard ring formed to contact a substrate or an ion implantation layer in a cell structure so as to form a draining channel for thermoelectrons generated at the substrate or the ion implantation layer, thereby preventing electrical crosstalk, and a system including the same.

Some embodiments of the present inventive concept also provide a backside illumination image sensor including a noise blocking area in a deep guard ring to isolate a block, thereby effectively eliminating substrate crosstalk noise, and a system including the same.

Some embodiments of the present inventive concept also provide a method of manufacturing the image sensor.

Additional features and utilities of the present general inventive concept will be set forth in part in the description which follows and, in part, will be obvious from the description, or may be learned by practice of the general inventive concept.

According to some embodiments of the present inventive concept, there is provided a backside illumination image sensor including an ion implantation layer, an epitaxial layer disposed at a backside of the on implantation layer, a first type well disposed on the epitaxial layer, a second type well disposed on the epitaxial layer except for a portion on which the first type well is disposed, a deep guard ring formed in the epitaxial layer to contact the first type well and extent to the backside of the on implantation layer, an interlayer wiring and insulation layer disposed on the first type well and the second type well, and a semiconductor substrate bonded to the interlayer wiring and insulation layer.

The backside illumination image sensor may further include a noise blocking area formed at the deep guard ring.

According to other embodiments of the present inventive concept, there is provided a method of manufacturing a backside illumination image sensor. The method includes forming a first semiconductor substrate, forming an epitaxial layer on the first semiconductor substrate, forming a first type well on the epitaxial layer, forming a second type well on the epitaxial layer except for a portion on which the first type well is formed, forming a deep guard ring in the epitaxial layer to contact the first type well and extend to the first semiconductor substrate, forming an interlayer wiring and insulation layer on the first type well and the second type well, removing the first semiconductor substrate, bonding a second semiconductor substrate to the interlayer wiring and insulation layer, and forming an ion implantation layer at a backside of the epitaxial layer.

According to other embodiments of the present inventive concept, there is provided a method of manufacturing a backside illumination image sensor, the method including: forming an epitaxial layer on a first semiconductor substrate; forming a first type well and a second type well at both sides of the first type well and on the epitaxial layer; forming a deep guard ring in the epitaxial layer to contact the first type well and extend to the first semiconductor substrate; forming an interlayer wiring and insulation layer on the first type well and the second type well; bonding a second semiconductor substrate to the interlayer wiring and insulation layer; and replacing the first semiconductor substrate connected with the epitaxial layer with an ion implantation layer.

In an embodiment, the method further includes forming a deep well to surround the deep guard ring in the epitaxial layer and corresponding to ground terminals among the interlayer wiring to contact the second type well and to extend to the first semiconductor substrate after forming the interlayer wiring and insulation layer.

In an embodiment, the forming of a first type well and a second type well may be performed subsequently with two separate masks.

In an embodiment, the deep guard ring may be formed using a deep N-type ion implantation used in a deep photodiode isolation process.

In an embodiment, the method may further include forming a noise blocking area in the ion implantation layer at the deep guard ring.

In an embodiment, the noise blocking area may be formed by forming a shallow trench in the ion implantation layer corresponding to the deep guard ring.

In an embodiment, the noise blocking area may be formed by using a mask while forming the ion implantation layer.

In an embodiment, the deep guard ring may be formed in the epitaxial layer by using deep N-type ion implantation used in a deep photodiode isolation process.

BRIEF DESCRIPTION OF THE DRAWINGS

The above and other features and utilities of the present inventive concept will become more apparent by describing in detail exemplary embodiments thereof with reference to the attached drawings in which:

FIGS. 3A through 3H are cross-sectional views of stages in the process of manufacturing the backside illumination image sensor illustrated in FIG. 2;

FIGS. 6A through 6G are cross-sectional views of stages in the process of manufacturing the backside illumination image sensor illustrated in FIG. 5;

DETAILED DESCRIPTION OF THE PREFERRED EMBODIMENTS

Figure 1:
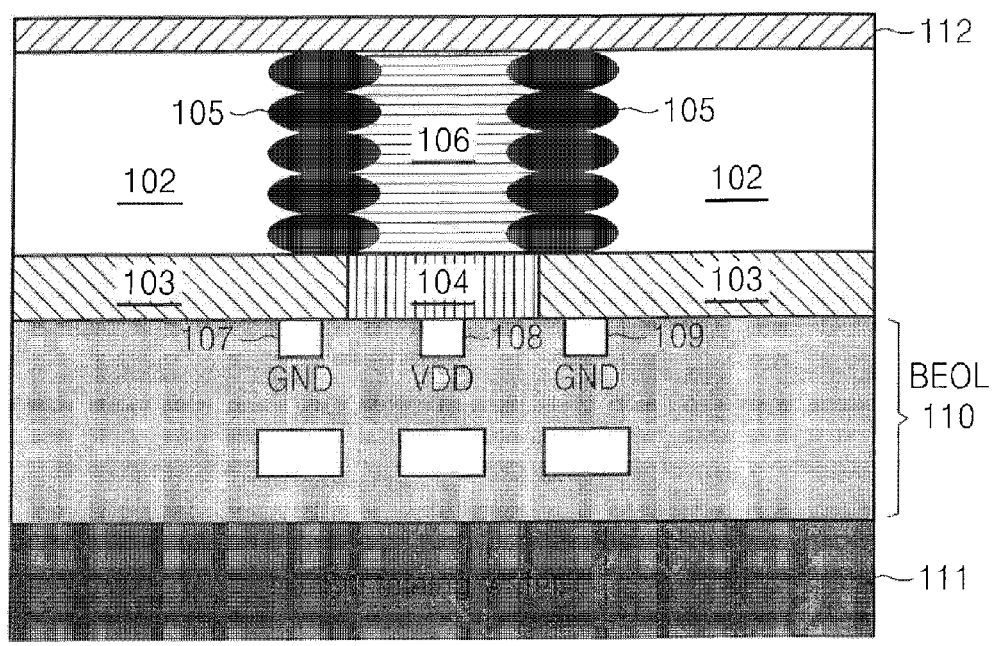
FIG. 1 is a cross-sectional view of a backside illumination image sensor, which includes a deep guard ring, according to some embodiments of the present inventive concept.

The present inventive concept now will be described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Image sensors according to embodiments of the present inventive concept include a charge coupled device (CCD) image sensors and complementary metal-oxide-semiconductor (CMOS) image sensors. COD image sensors provide less noise and better picture quality than CMOS image sensors, but require higher voltage and higher manufacturing cost. CMOS image sensors have a simple operation mode and can be implemented in various scanning modes. In addition, CMOS image sensors enable a signal processing circuit to be integrated into a single chip, so that products can be miniaturized. Moreover, CMOS image sensors can be manufactured using CMOS processes, thereby reducing manufacturing cost. Since CMOS image sensors have low power consumption, they can easily used for products having limited battery capacity. Therefore, a CMOS image sensor is exemplified as an image sensor according to the embodiments of the present inventive concept. However, it will be apparent that the technical ideas of the present inventive concept also apply to COD image sensors.

A CMOS image sensor may include a pixel area, a circuit area, and a pad area formed in a semiconductor substrate. A plurality of photodiodes may be formed in the pixel area. A plurality of driving circuits may be formed in the circuit area. A plurality of contact pads may be formed in the pad area.

In the pixel area may be formed a pixel array in which a plurality of photoelectric converters are arranged in a matrix form.

Each of the photoelectric converters in the pixel array may absorb incident light and accumulate a charge corresponding to the quantity of the absorbed light. Each photoelectric converter may be implemented by a photodiode, a phototransistor, a photo gate, a pinned photodiode (PPD), or a combination thereof, but the present inventive concept is not restricted thereto.

Such CMOS image sensor may operate in response to driving power, e.g., a driving voltage or a ground voltage, or a driving signal provided from an outside through the contact pads in the pad area.

FIG. 1 is a cross-sectional view of a backside illumination image sensor 100, which includes a deep guard ring 106, according to some embodiments of the present inventive concept.

The backside illumination image sensor 100 uses a P-substrate as a first semiconductor substrate (not shown). A substrate influences the characteristics of an image sensor a lot and has advantages and disadvantages according to its type. In general, a P-substrate is advantageous in terms of sensitivity but is disadvantageous in terms of dark current and crosstalk characteristics. On the other hand, an N-substrate is disadvantageous in terms of sensitivity but advantageous in terms of dark current and crosstalk characteristics. In other embodiments of the present inventive concept, the N-substrate may be used.

There is enough space for many semiconductor structures like deep wells on a P+type substrate (not shown). A P-type-epitaxial layer (hereinafter, referred to as an epitaxial layer) 102 is formed to a thickness of 5 through 15 µm. A thin P well 103 and a thin N well 104 are formed on the epitaxial layer 102 to form a device appropriate for a CMOS operation. In detail, the thin P well 103 is formed around a portion at which a photodiode will be formed in an active pixel sensor (APS) array area to enable ground (GND) terminals 107 and 109 to be connected afterwards. The thin N well 104 is formed at the portion at which the photodiode will be formed to enable an operating voltage (VDD) terminal 108 to be connected afterwards.

At this time, the deep guard ring 106 may be formed in the epitaxial layer 102 below the thin N well 104. The deep guard ring 106 may be formed using deep N-type ion implantation used in a deep photodiode isolation process. In detail, phosphorous (P) may be implanted at an energy of 2 MeV and at a dosage of $2E13/cm^2$ to form a deep N well as the deep guard ring 106. The deep guard ring 106 may be formed to contact the backside of an ion implantation layer 112 viewed from the substrate. The deep guard ring 106 is formed to contact the thin N well 104 below the VDD terminal 108 so that it functions as an electrical passage through which thermoelectrons generated at the ion implantation layer 112 are drained quickly to the VDD terminal 108. Ion implantation energy is adjusted especially when the thin N well 104 disposed on the deep guard ring 106 is formed so that the thin N well 104 is electrically well conductive.

A deep guard ring fringe 105 may be formed at a portion which contacts the GND terminals 107 and 109 and surrounds the deep guard ring 106 in the epitaxial layer 102 below the thin P well 103. The deep guard ring fringe 105 may be formed by implanting boron (B) or boron fluoride (BF2) at an energy of about 2 eV and at a dosage of $2E13/cm^2$ to form a deep P well (hereinafter, the deep guard ring fringe 105 is referred to as the deep P well 105) so that the deep P well 105 contacts the thin P well 103 and the substrate or the ion implantation layer 112. The deep P well 105 is formed to contact the ion implantation layer 112, thereby preventing thermoelectrons generated at the on implantation layer 112 from escaping from being drained to the VDD terminal 108 and leaking into the epitaxial layer 102.

Devices are usually driven by electrons or holes at a substrate surface channel. However, photodiodes are driven when blue light, green light, and red light are absorbed by the epitaxial layer 102 and increases cumulative sensitivity at the photodiodes. Since the red light has a longest wavelength of 0.4 to 5 µm, a photodiode needs to have a depth of at least 2 µm. In other words, when the deep guard ring 106 and the deep P well 105 are provided, electrical crosstalk, in which negative charges generated from incident light are transferred not to a photodiode of a pixel receiving the incident light but to a photodiode of an adjacent pixel, can be reduced. In detail, since the red light having the long wavelength spreads deep down from the surface of the substrate, an electron-hole pair (EHP) may be generated in a lower substrate 111 below a photodiode as well as in the photodiode and negative charge generated by the light having the long wavelength highly likely move to a photodiode of an adjacent pixel instead of moving to a photodiode of a current pixel receiving the light. However, in the embodiments of the present inventive concept, the deep guard ring 106 is positioned at a passage through which negative charges move to an adjacent photodiode and has a higher potential than surroundings, and therefore, the deep guard ring 106 draws and drains the negative charges, thereby reducing electrical crosstalk.

The deep P well 105 surrounding the deep guard ring 106 forms a potential barrier so that charges generated deep in the substrate do not flow into a photodiode and increases electron-hole recombination. As a result, crosstalk occurring between pixels due to random drift of charges is reduced. In other words, even when a procedure of forming a deep N well is omitted, the backside illumination image sensor 100 according to the current embodiments of the present inventive concept isolates thermoelectrons from the epitaxial layer 102 and drains them to the VDD terminal 108 using the deep guard ring 106. In addition, when the deep guard ring fringe 105 is formed as a deep P well, GND powering which prevents current in the VDD terminal 108 from easily leaking into other circuits can be expected.

An interlayer wiring and insulation layer 110 are formed on the thin wells 103 and 104. A second semiconductor substrate 111 is formed on the interlayer wiring and insulation layer 110 to keep the backside illumination image sensor 100 intact. The first semiconductor substrate (not shown) at the back of the backside illumination image sensor 100 is removed and then the ion implantation layer 112 is formed.

Figure 2:
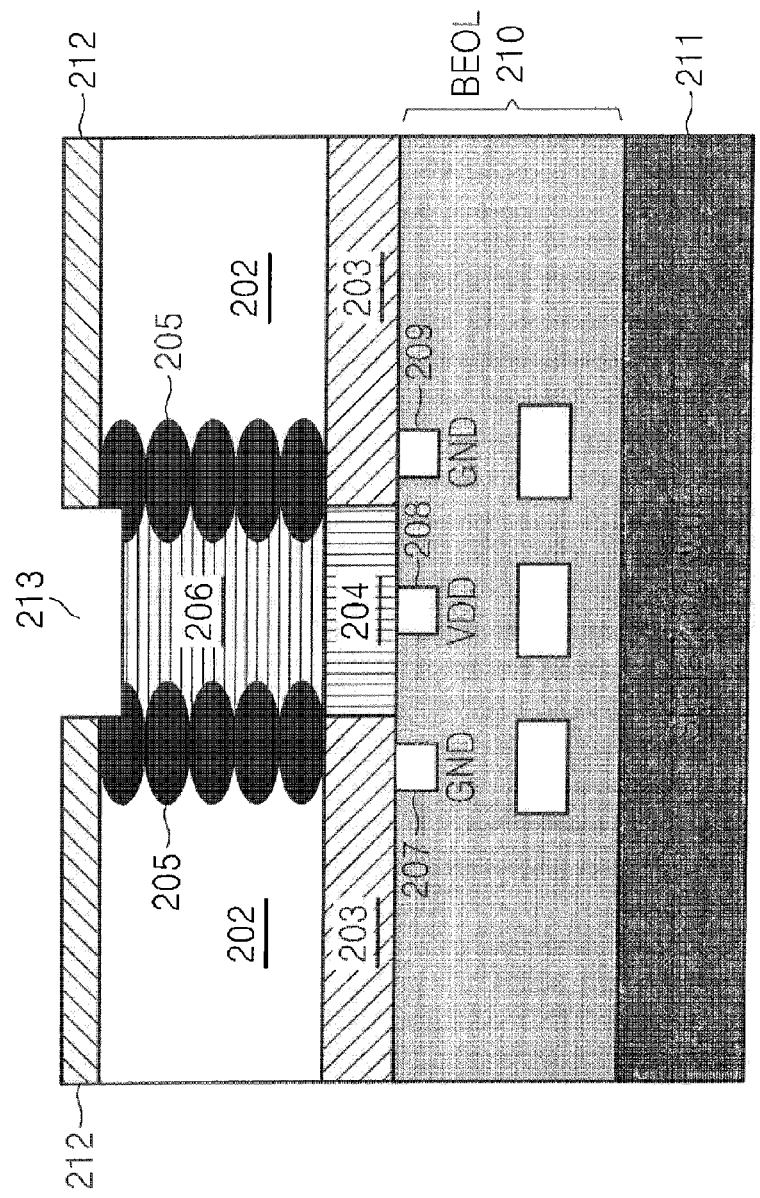
FIG. 2 is a cross-sectional view of a backside illumination image sensor, which includes a deep guard ring and a shallow trench isolation structure at the back, according to other embodiments of the present inventive concept.

FIG. 2 is a cross-sectional view of a backside illumination image sensor 200, which includes a deep guard ring 206 and a shallow trench isolation structure at the back, according to other embodiments of the present inventive concept.

Referring to FIG. 2, the backside illumination image sensor 200 further includes a noise blocking area 213 in addition to the structure illustrated in FIG. 1. Thus, descriptions of the backside illumination image sensor 200 will focus on differences from the backside illumination image sensor 100 illustrated in FIG. 1. The noise blocking area 213 is implemented by forming a shallow trench in an ion implantation layer 212 corresponding to a portion where a photodiode is formed, i.e. a deep guard ring 206. At this time, the trench may be formed to a depth of 0.5 through 2.0 µm.

Since this shallow trench, i.e., the noise blocking area 213 divides the ion implantation layer 212 into two portions and separates them from each other, particular major blocks or a pixel block, an analog block, and a digital block may be separated from one another, thereby effectively eliminating substrate crosstalk noise.

FIGS. 3A through 3H are cross-sectional views of stages in the process of manufacturing the backside illumination image sensor 200 illustrated in FIG. 2. FIG. 4 is a flowchart of the process of manufacturing the backside illumination image sensor 200 illustrated in FIG. 2.

Figure 3A:
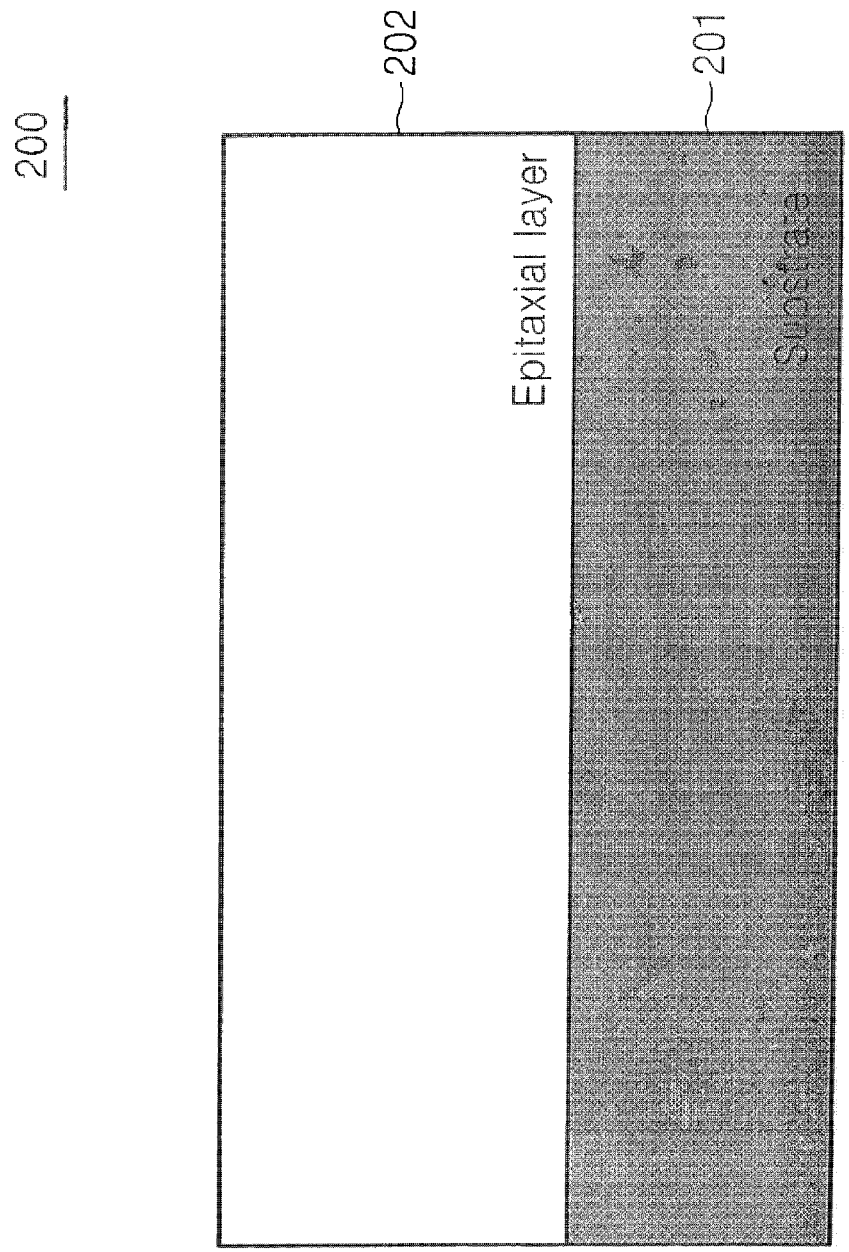
Figure 3B:
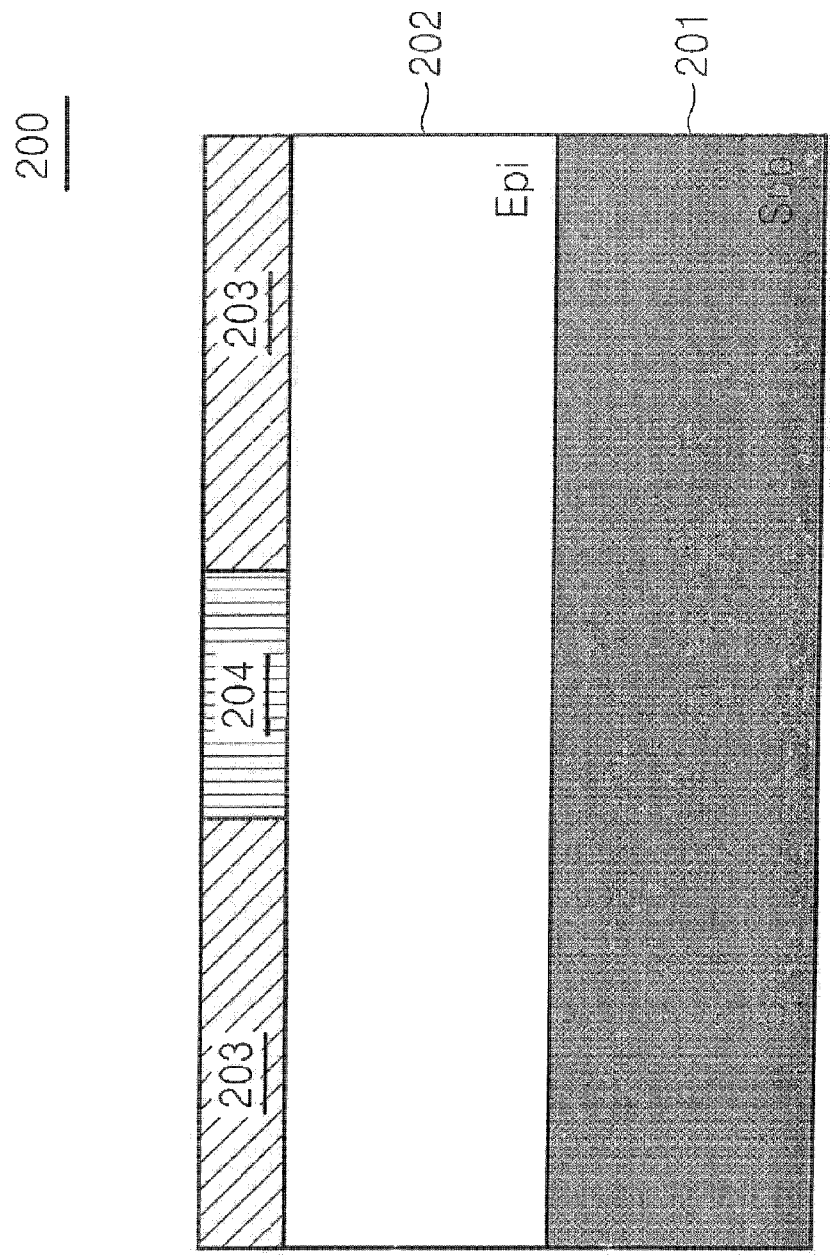
Figure 3C:
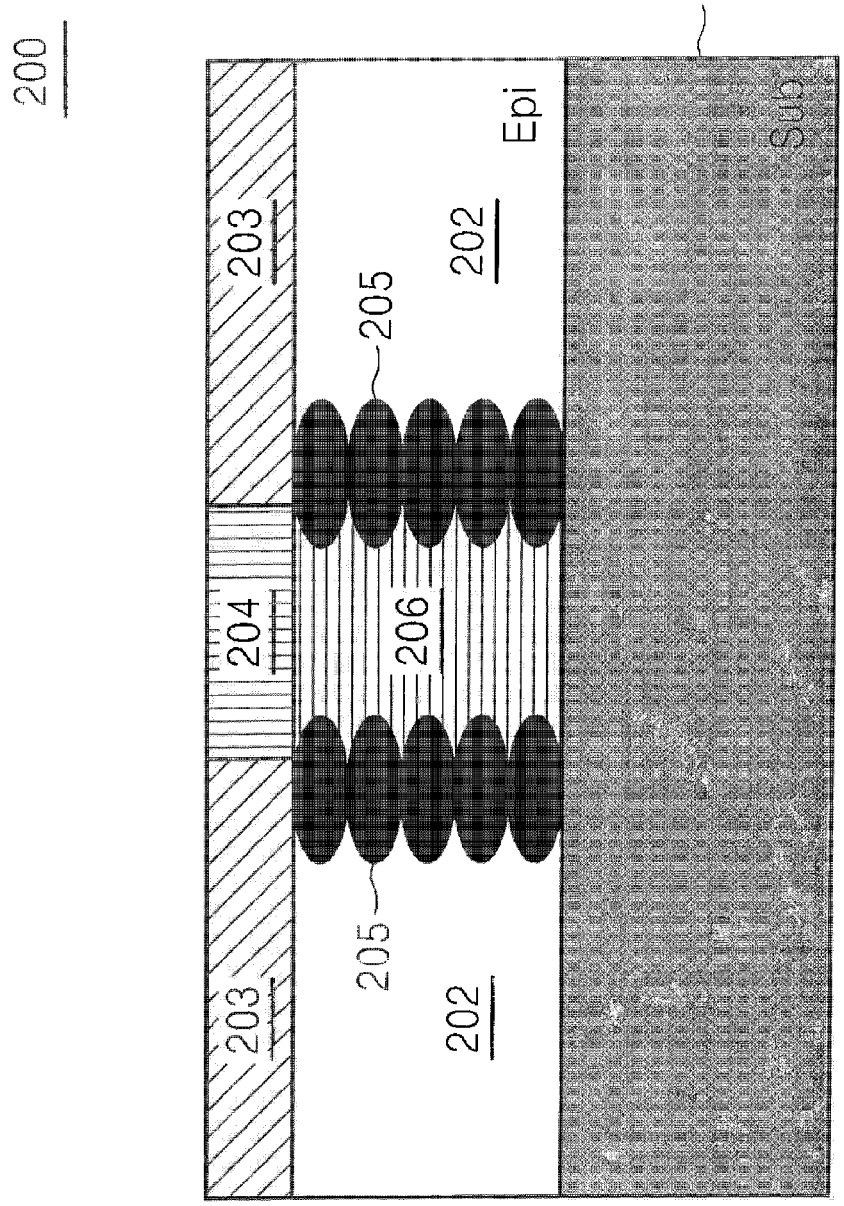
Figure 3E:
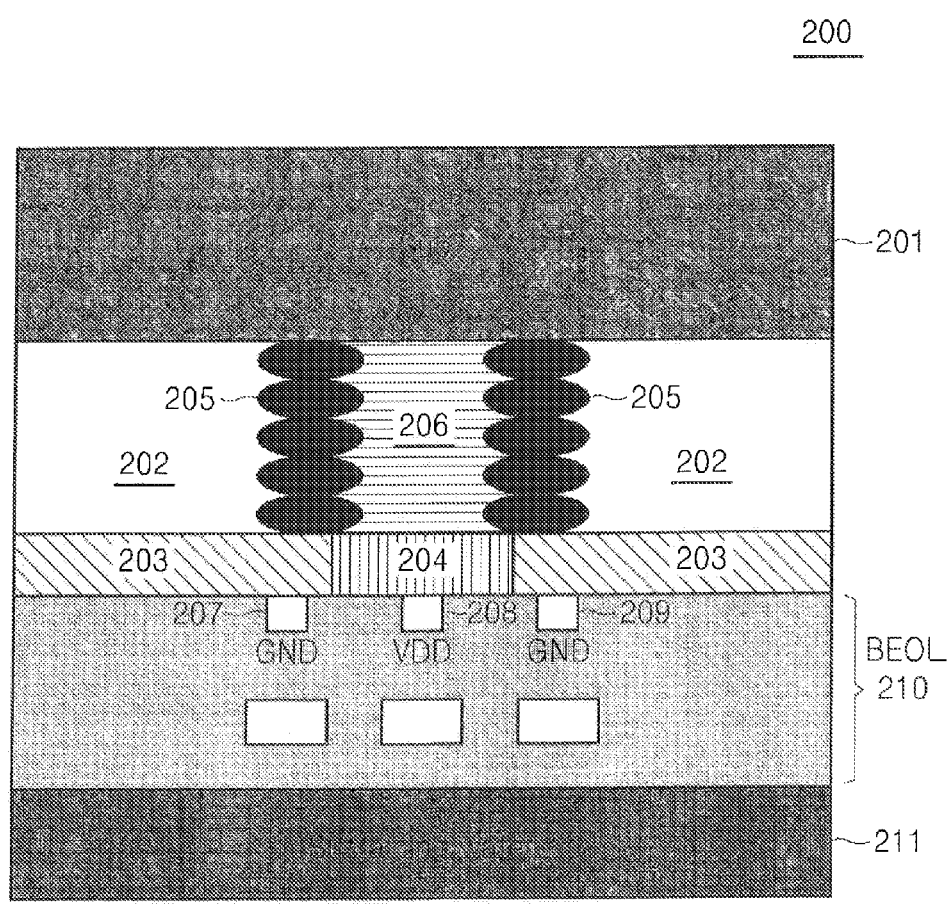
Figure 3F:
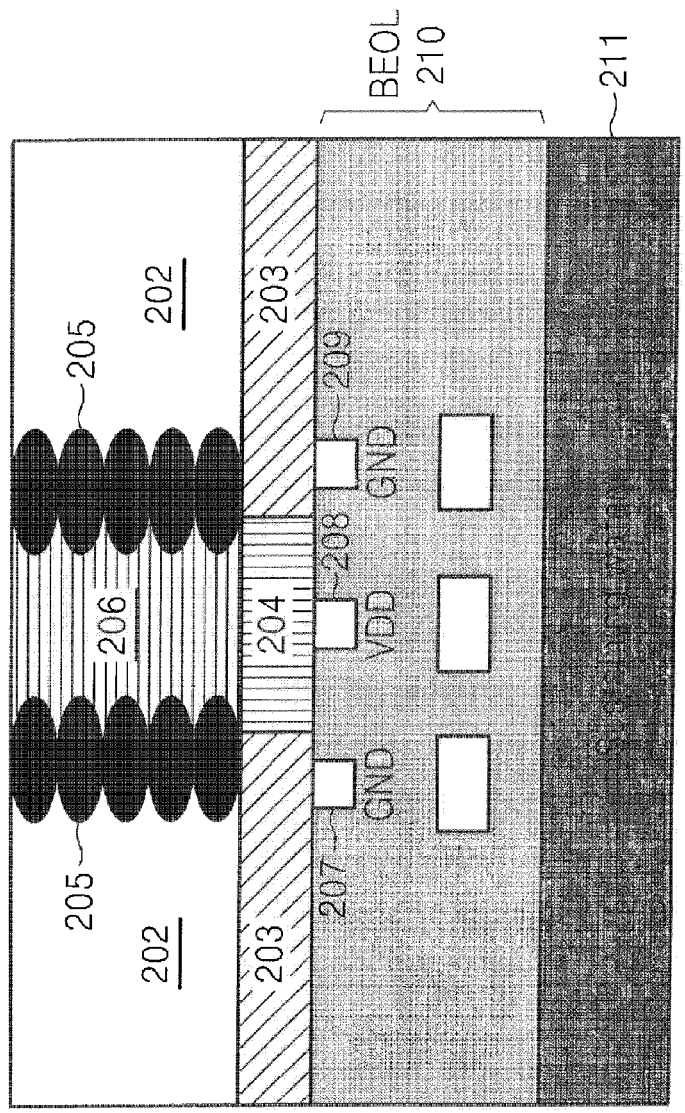
Figure 3G:
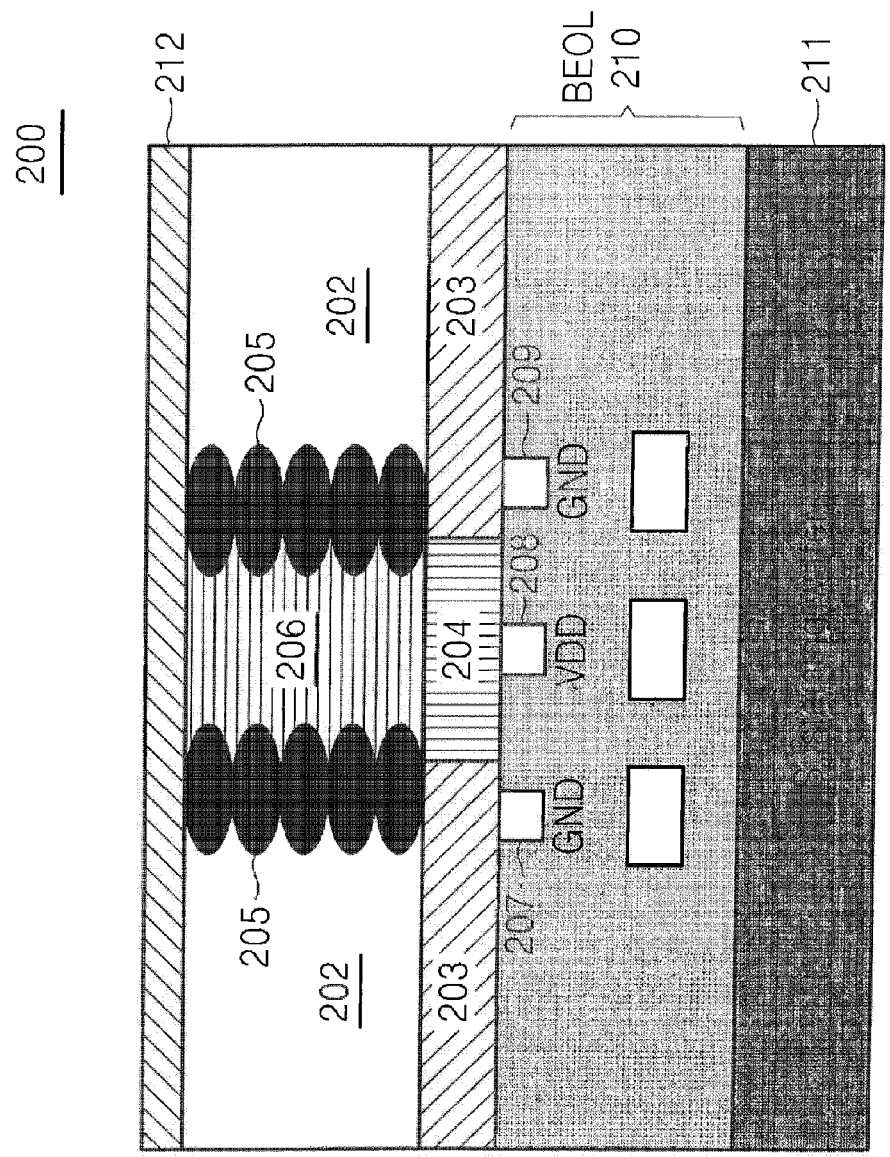
Figure 4:
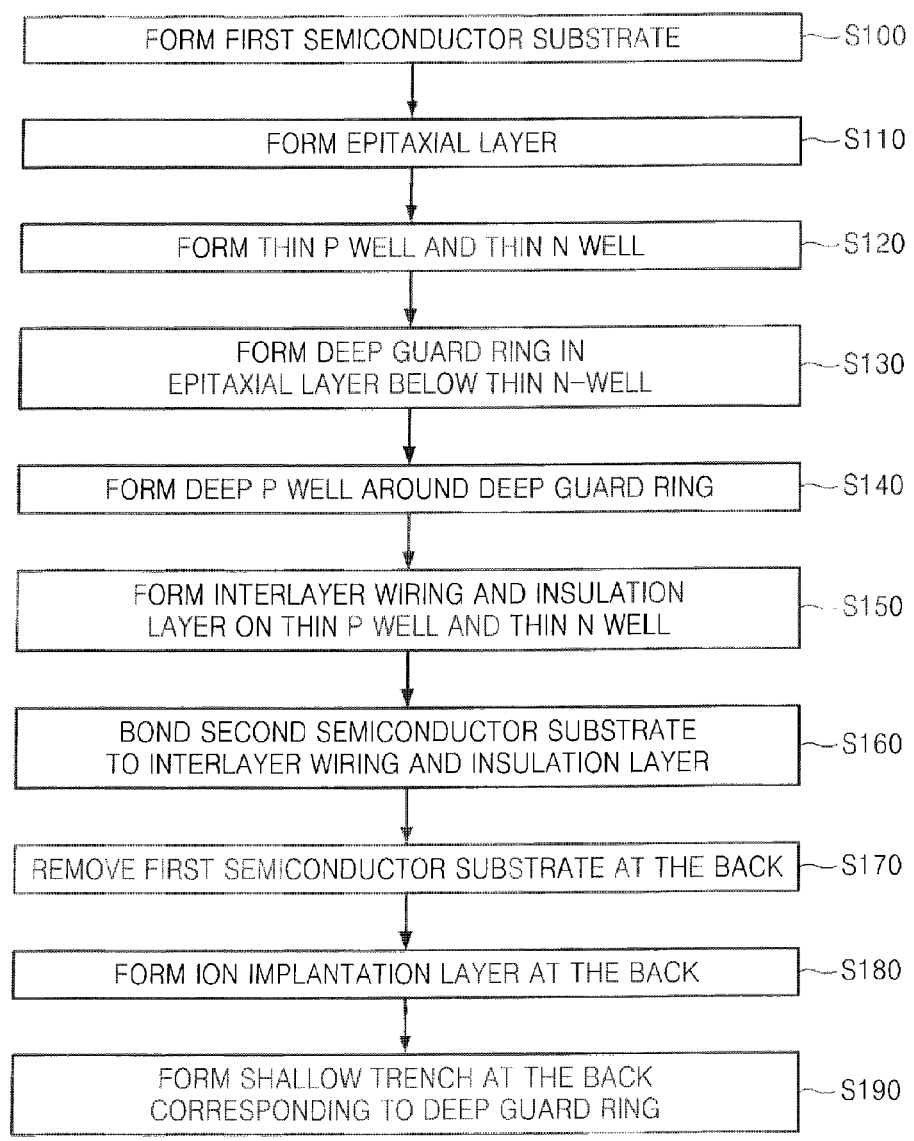
FIG. 4 is a flowchart of the process of manufacturing the backside illumination image sensor illustrated in FIG. 2.

Referring to FIGS. 3A through 4, an epitaxial layer 202 is formed on a first semiconductor substrate 201 in operations $S_{100}$ and $S_{110}$ as shown in FIG. 3A. A substrate influences the characteristics of an image sensor a lot and has advantages and disadvantages according to its type. In general, a P type-substrate is advantageous in terms of sensitivity but is disadvantageous in terms of dark current and crosstalk characteristics. On the other hand, an N type-substrate is disadvantageous in terms of sensitivity but advantageous in terms of dark current and crosstalk characteristics.

When light is emitted into a substrate, an EHP (electron-hole pair) is formed. An electron and a hole are drifted by an electronic field within a depleted region, but they spread in any direction outside the depleted region because the electronic field does not exist. Electrons and holes having such nondirectional movement are more likely to be accumulated at an adjacent pixel than at a current pixel, which causes crosstalk. For example, as a result of these electrons and holes drifting in any direction outside the depleted region to cross into adjacent pixels, these improperly placed electrons and holes cause noise within the pixels in which they do not belong.

Meanwhile, due to thermoelectrons thermally generated in a state without light and electrons or holes generated by cosmic rays, alpha particles, or radiation, particles that may cause a lot of dark current or noise may exist in the substrate.

Accordingly, it is needed to form an electrical passage to selectively drain electrons or holes having nondirectional movement or other noise-causing particles. Electrons are usually drained to a VDD terminal and holes are usually drained to a GND terminal. However, when a P type-substrate is used, the VDD terminal cannot be simultaneously used to hold a substrate voltage, and therefore, a substrate voltage terminal needs to be separately provided or a structure for holding the substrate voltage needs to be provided in a package.

The epitaxial layer 202 is formed to a thickness of 5 through 15 μm because it is a space in which many semiconductor structures including a deep well will be formed.

Referring to FIG. 3B, a thin P well 203 and a thin N well 204 are formed to be appropriate to the characteristics of a CMOS operation in operation $S_{120}$. The thin P well 203 is formed around an area, which a photodiode will be formed in, to be connected to GND terminals 207 and 209 later. The thin N well 204 is formed on an area, which the deep guard ring 206 will be formed below, to be connected to a VDD terminal 208 later. The thin P well 203 and the thin N well 204 are formed by ion-implanting N-type impurities and P-type impurities using different masks, respectively. At this time, ion-implantation energy is adjusted so that the thin N well 204 disposed on the deep guard ring 206 is electrically well conductive.

Referring to FIG. 3C, the deep guard ring 206 is formed in the epitaxial layer 202 below the thin N well 204 in operation $S_{130}$. The deep guard ring 206 may be formed using deep N-type ion implantation used in a deep photodiode isolation process. In detail, phosphorous (P) may be implanted at an energy of 2 MeV and at a dosage of $2E13/cm^2$ to form a deep N well as the deep guard ring 206. The deep guard ring 206 may be formed to contact the backside of the ion implantation layer 212 viewed from the first semiconductor substrate 201. The deep guard ring 206 is formed to contact the thin N well 204 below the VDD terminal 208 so that the deep guard ring 206 functions as an electrical passage through which thermoelectrons generated at the on implantation layer 212 are drained quickly to the VDD terminal 208. Ion implantation energy is adjusted especially when the thin N well 204 disposed on the deep guard ring 206 is formed so that the thin N well 204 is electrically well conductive. The backside illumination image sensor 200 including the deep guard ring 206 can isolate thermoelectrons from the epitaxial layer 202 and drain them to the VDD terminal 208 using the deep guard ring 206, without a procedure of forming a deep N well (DNW), that is, without a DNW process.

A deep guard ring fringe 205 may be formed at a portion which contacts the GND terminals 207 and 209 and surrounds the deep guard ring 206 in the epitaxial layer 202 below the thin P well 203. The deep guard ring fringe 205 may be formed using deep P-type ion implantation used in a deep photodiode isolation process. The deep guard ring fringe 205 may be formed by implanting boron (B) or boron fluoride (BF2) at an energy of about 2 eV and at a dosage of $2E13/cm^2$ to form a deep P well (hereinafter, the deep guard ring fringe 205 is referred to as the deep P well 205) so that the deep P well 205 contacts the thin P well 203 and the first semiconductor substrate 201. The deep P well 205 is formed to contact the ion implantation layer 212 later, thereby preventing thermoelectrons generated at the ion implantation layer 212 from escaping from being drained to the VDD terminal 208 and leaking into the epitaxial layer 202. In other words, when the deep guard ring fringe 205 is formed as a deep P well, GND powering which prevents current in the VDD terminal 208 from easily leaking into other circuits can be expected.

Referring to FIG. 3D, an interlayer wiring and insulation layer 210 is formed on the thin N well 204 for connection of the VDD terminal 208 and on the thin P well 203 for connection of the GND terminals 207 and 209 in operation S150. At this time, the interlayer wiring and insulation layer 210 may include a plurality of metal lines and an inter-metal dielectric (IMD) material. The metal lines may form electrical wiring necessary for the sensing operation of a pixel array.

Referring to FIG. 3E, a device is turned upside down and a second semiconductor substrate 211 is bonded to the interlayer wiring and insulation layer 210 in operation S160. In other words, the interlayer wiring and insulation layer 210 is bonded to a wafer for holding the shape of the backside illumination image sensor 200.

Referring to FIG. 3F, the first semiconductor substrate 201 which has held the device is removed to create a backside light receiving element in the backside illumination image sensor 200 in operation S170.

Referring to FIG. 3G, the ion implantation layer 212 is formed to create the backside light receiving element in operation 5180.

Referring to FIG. 3H, the noise blocking area 213 is formed at the deep guard ring 206. The noise blocking area 213 may be formed by forming a shallow trench in the ion implantation layer 212 corresponding to the deep guard ring 206 in operation S190. The trench may have a depth of 0.5 through 2.0 μm. This shallow trench, i.e. the noise blocking area 213 divides the ion implantation layer 212. The divided ion implantation layer 212 uses the deep P well 205, thereby enhancing GND powering. While a front side illumination image sensor is easily exposed to noise flowing along a substrate because the substrate cannot be detached, the backside illumination image sensor 200 separates particular blocks or pixels, analog and digital blocks from one another using the noise blocking area 213 dividing the ion implantation layer 212, thereby effectively eliminating crosstalk noise between the blocks.

Figure 5:
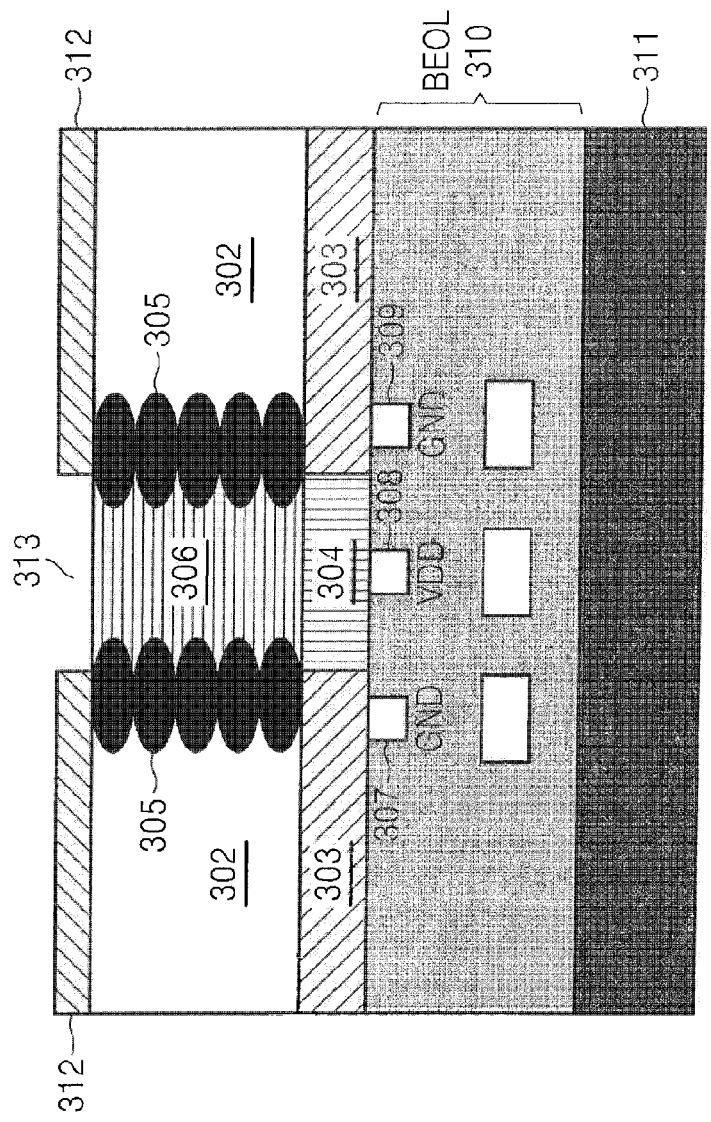
FIG. 5 is a cross-sectional view of a backside illumination image sensor, which includes a deep guard ring and a masked on implantation layer structure at the back, according to further embodiments of the present inventive concept.

FIG. 5 is a cross-sectional view of a backside illumination image sensor 300, which includes a deep guard ring 306 and a masked ion implantation layer structure 313 at the back, according to further embodiments of the present inventive concept. The backside illumination image sensor 300 illustrated in FIG. 5 further includes a noise blocking area, i.e. the masked ion implantation layer structure 313 in addition to the structure illustrated in FIG. 1. Thus, descriptions of the backside illumination image sensor 300 will focus on differences from the backside illumination image sensor 100 illustrated in FIG. 1.

The noise blocking area 313 is formed by forming an ion implantation layer 312 using a mask which prevents the ion implantation layer 312 from being formed at a deep guard ring 306.

The backside illumination image sensor 300 including the masked ion implantation layer structure 313 divides the ion implantation layer 312 and thus separates particular major blocks or pixels, analog and digital blocks from one another, thereby effectively eliminating crosstalk noise between the blocks.

FIGS. 6A through 6G are cross-sectional views of stages in the process of manufacturing the backside illumination image sensor 300 illustrated in FIG. 5. FIG. 7 is a flowchart of the process of manufacturing the backside illumination image sensor 300 illustrated in FIG. 5.

Figure 6A:
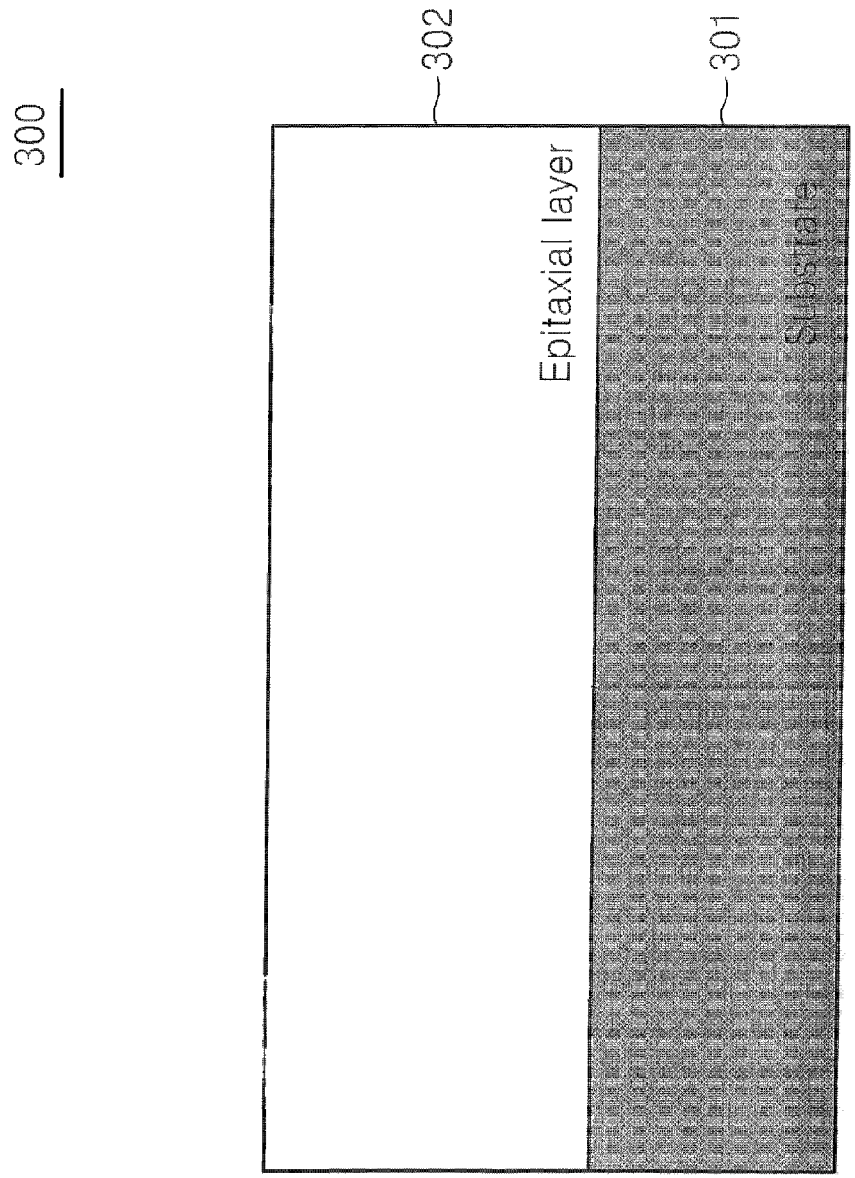
Figure 6B:
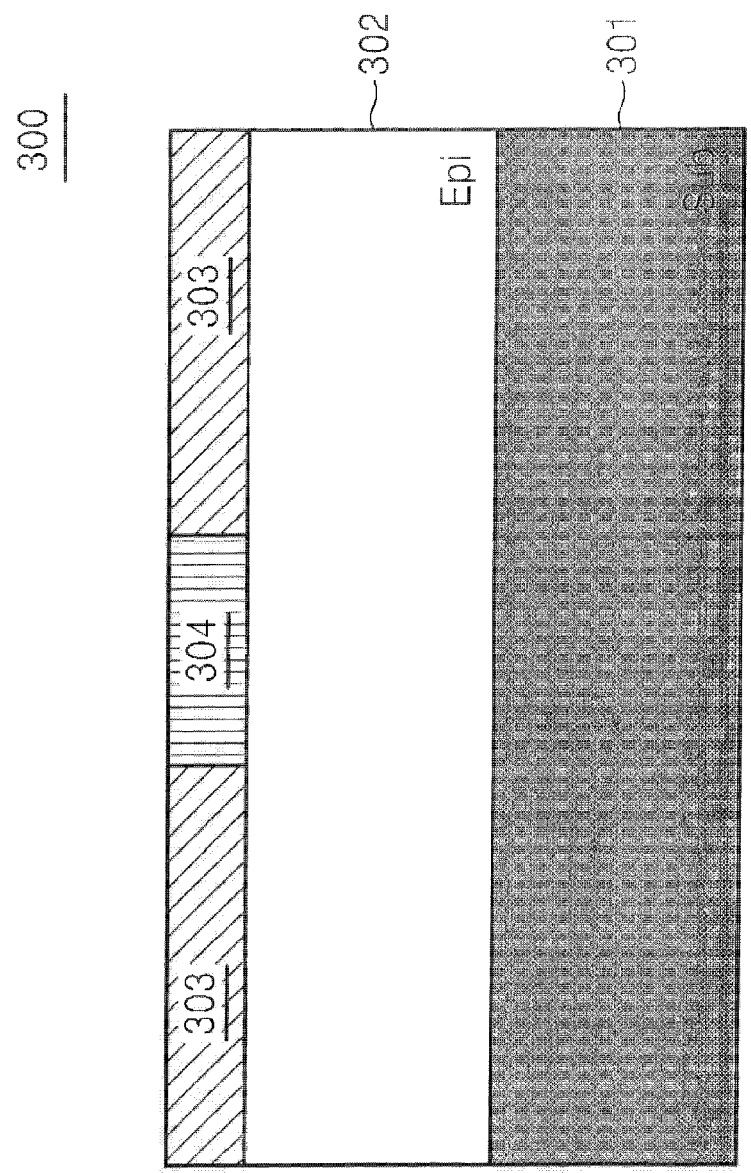
Figure 6C:
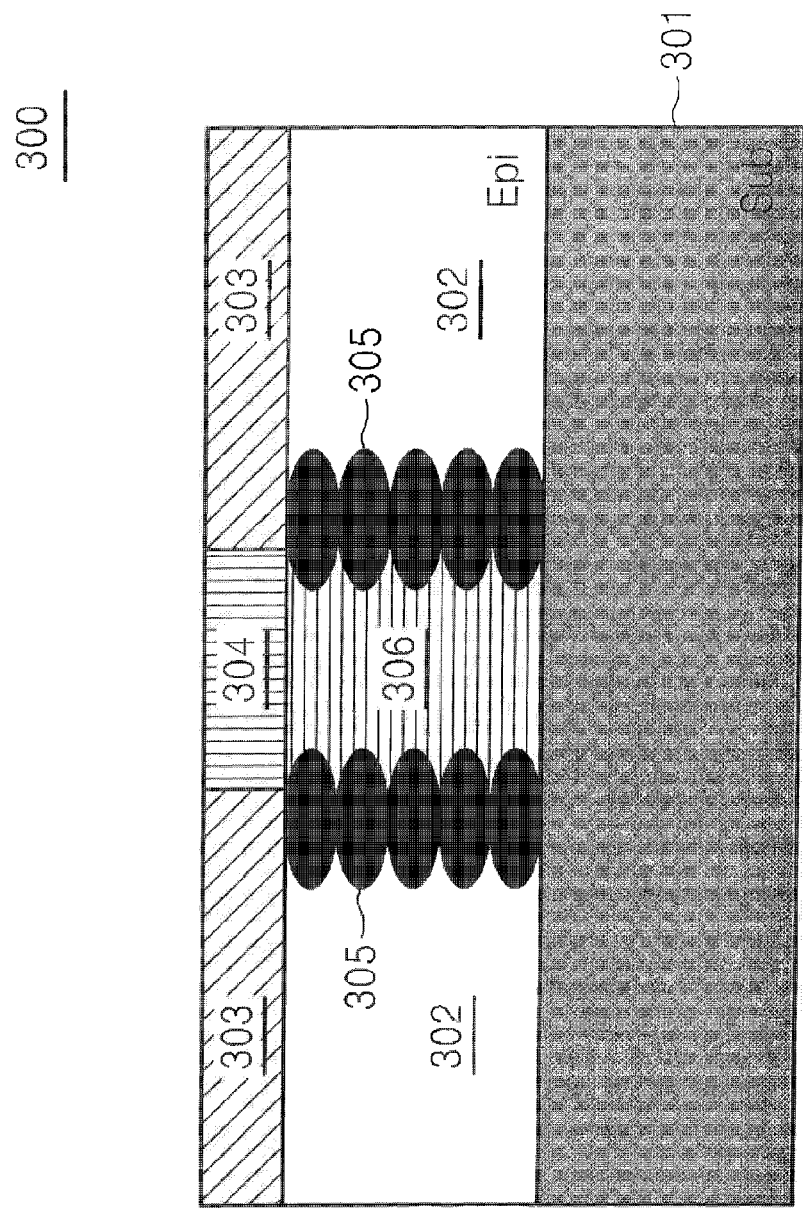
Figure 6E:
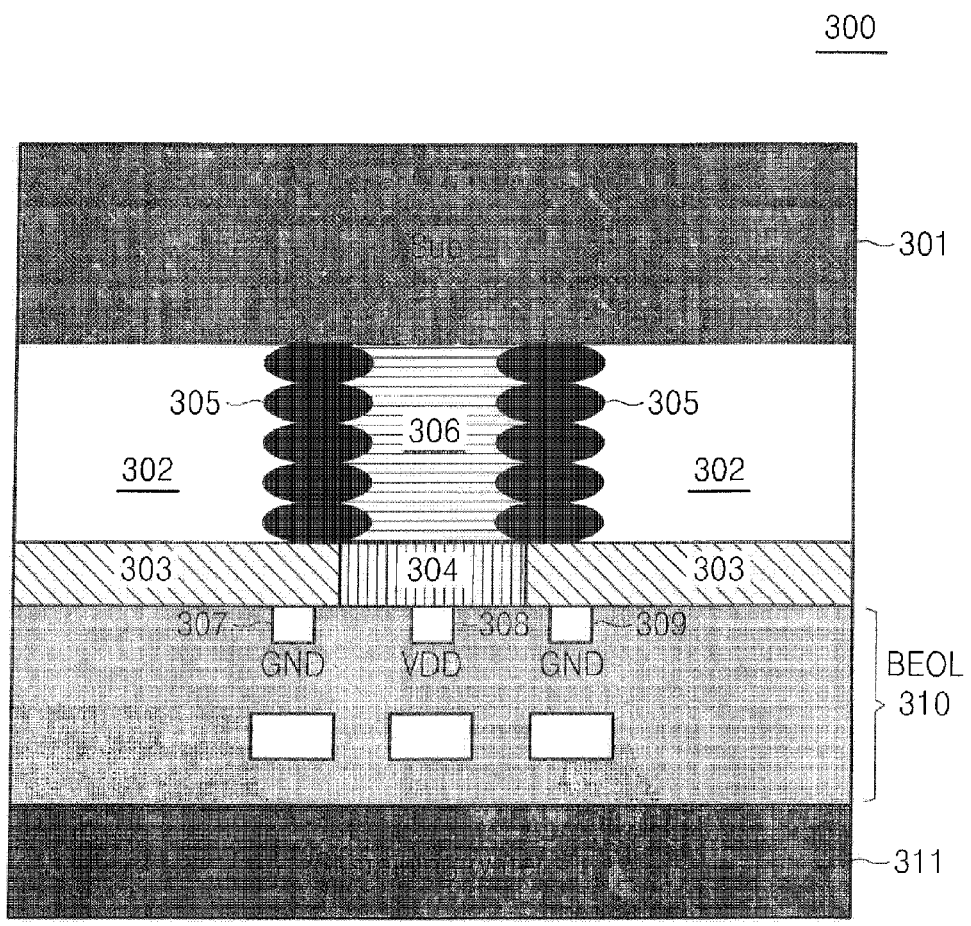
Figure 7:
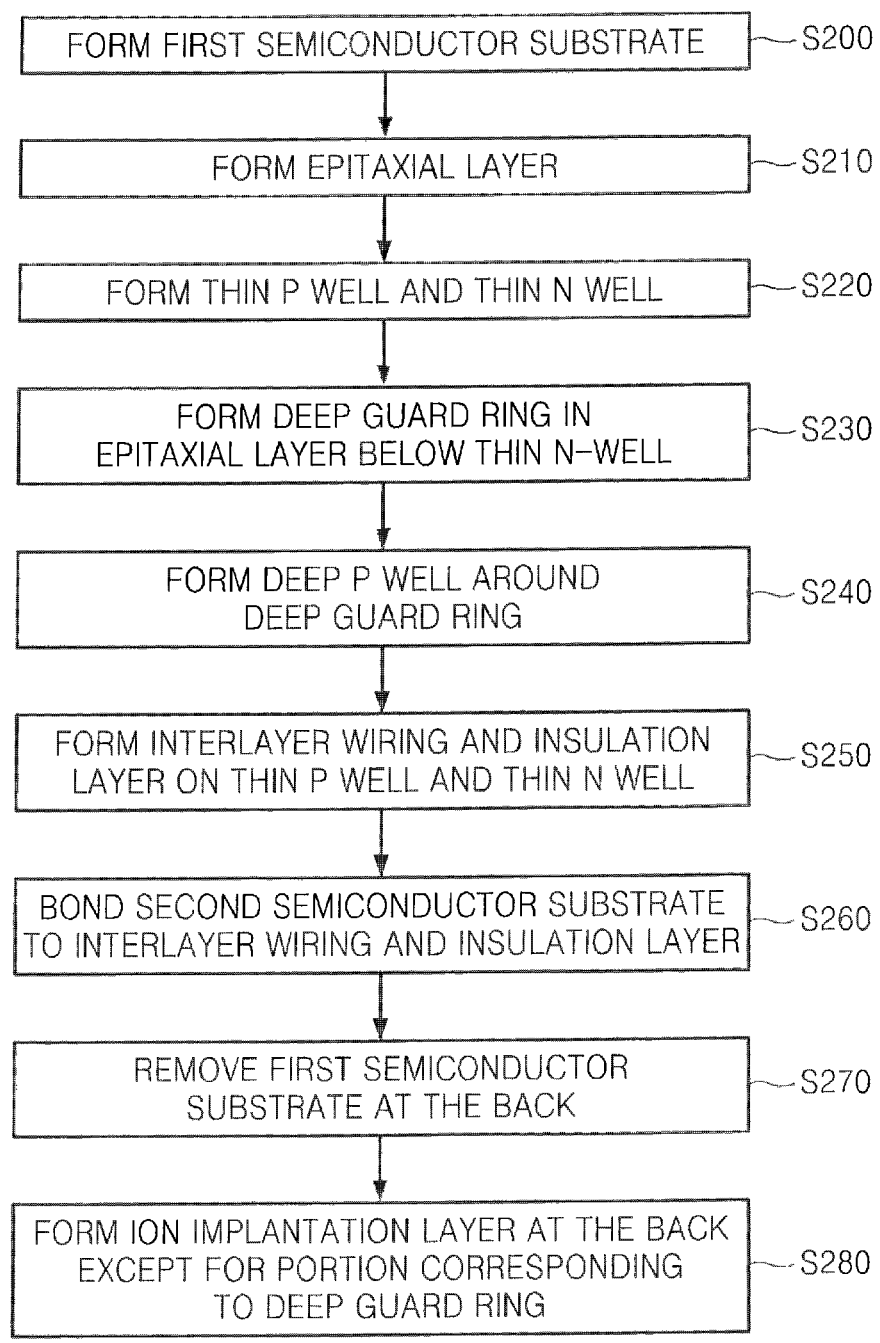
FIG. 7 is a flowchart of the process of manufacturing the backside illumination image sensor illustrated in FIG. 5.

The process of manufacturing the backside illumination image sensor 300 illustrated in FIGS. 6A through 7 is similar that illustrated in FIGS. 3A through 4. In other words, operations S200 through S270 and FIGS. 6A through 6F are similar to operations S100 through S170 and FIGS. 3A through 3F.

However, unlike the stages illustrated in FIGS. 3G and 3H in which the ion implantation layer 212 is formed on the entire surface of the device in operation S180 and then the shallow trench, i.e. the noise blocking area 213 is formed in operation S190, in the stage illustrated in FIG. 6G the mask is put on the device so that the ion implantation layer 312 is formed except for a portion corresponding to the deep guard ring 306 in operation S280. The process of manufacturing the backside illumination image sensor 300 is different from the process of manufacturing the backside illumination image sensor 200 in that the mask is used. By forming the masked ion implantation layer structure 313, the ion implantation layer 312 is divided. The divided ion implantation layer 312 uses a deep P well 305, thereby enhancing GND powering. While a front side illumination image sensor is easily exposed to noise flowing along a substrate because the substrate cannot be detached, the backside illumination image sensor 300 separates particular major blocks or pixels, analog and digital blocks from one another using the masked ion implantation layer structure 313 dividing the ion implantation layer 312, thereby effectively eliminating crosstalk noise between the blocks.

Figure 8:
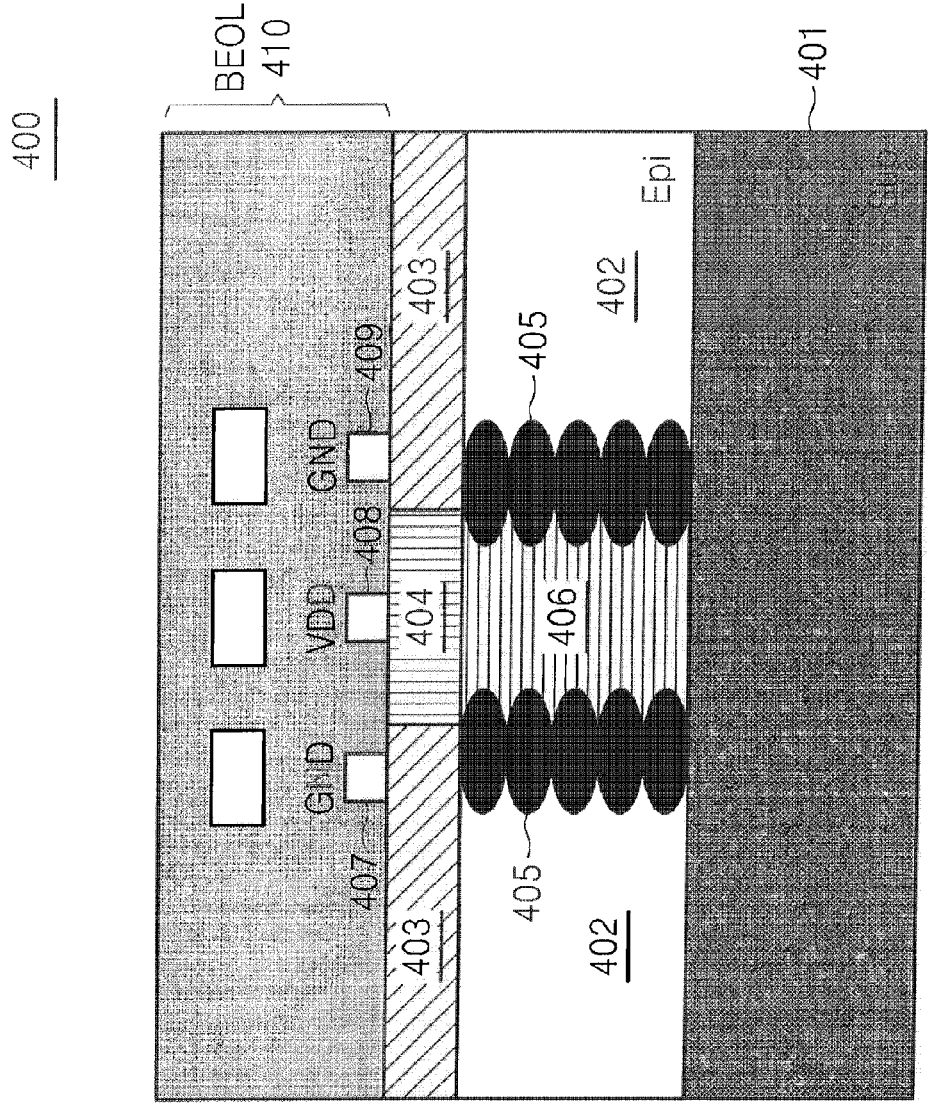
FIG. 8 is a cross-sectional view of a front side illumination image sensor, which includes a deep guard ring, according to some embodiments of the present inventive concept.

FIG. 8 is a cross-sectional view of a front side illumination image sensor 400, which includes a deep guard ring 406, according to some embodiments of the present inventive concept.

Referring to FIG. 8, since the front side illumination image sensor 400 includes the deep guard ring 406 similar to the deep guard ring 106 illustrated in FIG. 1, even when a procedure of forming a deep N well is omitted, thermoelectrons are isolated from the epitaxial layer 402 and drained to a VDD terminal 408 by the deep guard ring 406. In addition, when a deep guard ring fringe 405 is formed as a deep P well, GND powering which prevents current in the VDD terminal 408 from easily leaking into other circuits can be expected.

Meanwhile, the deep guard ring fringe 405 may be formed at a portion which contacts GND terminals 407 and 409 and surrounds the deep guard ring 406 in the epitaxial layer 402 below a thin P well 403. The deep guard ring fringe 405 may be formed by implanting boron (B) or boron fluoride (BF2) at an energy of about 2 eV and at a dosage of $2E13/cm^2$ to form a deep P well (hereinafter, the deep guard ring fringe 405 is referred to as the deep P well 405) so that the deep P well 405 contacts the thin P well 403 and a substrate 401. The deep P well 405 is formed to contact the substrate 401, thereby preventing thermoelectrons generated at an ion implantation layer 412 (not illustrated) from escaping from being drained to the VDD terminal 408 and leaking into the epitaxial layer 402.

Devices are usually driven by electrons or holes at a substrate surface channel. However, photodiodes are driven when blue light, green light, and red light are absorbed by the epitaxial layer 402 and increases cumulative sensitivity at the photodiodes. Since the red light has a longest wavelength of 0.4 to 5 μm, a photodiode needs to have a depth of at least 2 μm. In other words, when the deep guard ring 406 and the deep P well 405 are provided, electrical crosstalk, in which negative charges generated from incident light are transferred not to a photodiode of a pixel receiving the incident light but to a photodiode of an adjacent pixel, can be reduced. In detail, since the red light having the long wavelength spreads deep down from the surface of the substrate, an EHP may be generated in the substrate 401 below a photodiode as well as in the photodiode and negative charge generated by the light having the long wavelength highly likely move to a photodiode of an adjacent pixel instead of moving to a photodiode of a current pixel receiving the light. However, in the embodiments of the present inventive concept, the deep guard ring 406 is positioned at a passage through which negative charges move to an adjacent photodiode and has a higher potential than surroundings, and therefore, the deep guard ring 406 draws and drains the negative charges, thereby reducing electrical crosstalk.

The deep P well 405 surrounding the deep guard ring 406 forms a potential barrier so that charges generated deep in the substrate do not flow into a photodiode and increases electron-hole recombination. As a result, crosstalk occurring between pixels due to random drift of charges is reduced.

Figure 9:
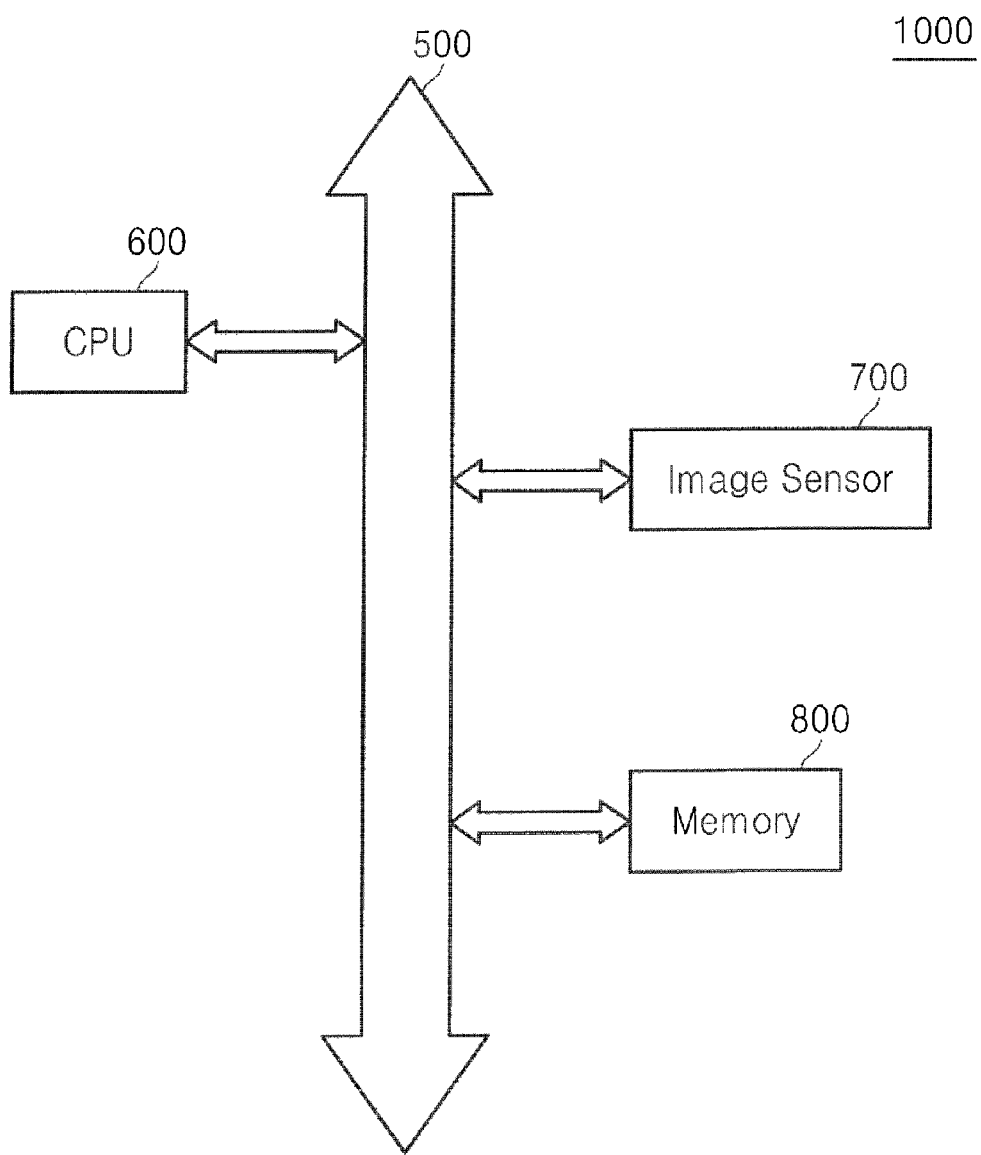
FIG. 9 is a schematic diagram of an image sensing system including an image sensor according to some embodiments of the present inventive concept.

FIG. 9 is a schematic diagram of an image sensing system 1000 including an image sensor 700 according to some embodiments of the present inventive concept. Referring to FIG. 9, the image sensing system 1000 may include a processor 600, the image sensor 700, and a memory device 800, which are connected to a system bus 500.

The processor 600 may generate control signals for controlling the operation of the image sensor 700 and the memory device 800. The image sensor 700 may generate an image of an object and the memory device 800 may store the image generated by the image sensor 700.

The image sensing system 1000 may be a computer system, a camera system, a scanner, a mechanized clock system, a navigation system, a video phone, a monitoring system, an auto focus system, a tracking system, a motion sensing system, or an image stabilization system, but the present inventive concept is not restricted thereto.

When the image sensing system 1000 is embodied as a portable application, the image sensing system 1000 may also include a battery (not shown) to supply operating power to the image sensor 700, the memory device 800, and the processor 600.

The portable application may be a portable computer, a digital camera, a personal digital assistant (PDA), a cellular telephone, an MP3 player, a portable multimedia player (PMP), an automotive navigation system, a memory card, or an electronic dictionary.

The image sensing system 1000 may also include an interface (not shown), e.g., an input/output unit, to communicate data with an external data processing device.

When the image sensing system 1000 is a wireless system, the image sensing system 1000 may also include a wireless interface (not shown). The wireless system may be a wireless device such as a PDA, a portable computer, a wireless telephone, a pager, or a digital camera; a radio frequency identification (RFID) reader; or an RFID system. The wireless system may also be a wireless local area network (WLAN) system or a wireless personal area network (WPAN) system. Moreover, the wireless system may be a cellular network.

The image sensor 700 may include a pixel array, a driving unit, and a connection unit. The image sensor 700 may sense light and convert it into an electrical signal in response to control signals from the processor 600, e.g., a central processing unit (CPU), thereby generating an image signal.

The image sensor 700 may be integrated with the CPU 600 and the memory device 800. Alternatively, the image sensor 700 may be integrated with a digital signal processor (DSP) or may be formed separately on a single chip.

As described above, the image sensor 700 includes a deep guard ring and a noise blocking area, which prevent crosstalk, dark current, or noise. Accordingly, crosstalk does not occur between adjacent blocks in the image sensor 700, so that a high-definition and highly-integrated image system can be easily manufactured using the image sensor 700.

A system including the image sensor 700 may be connected to a NAND or NOR flash memory card to store a high-definition image and provide functions enabling the image to be played or edited.

In addition, when digital systems are equipped with the image sensor 700, they can provide clear color images, so that vivid images can be obtained and applied in real time. When the image sensor 700 is connected to a video transmission system, realistic video information can be obtained in real time, anytime and anywhere, so that games, security, remote health care, and so no can be realized.

As described above, according to some embodiments of the present inventive concept, an image sensor and an image sensing system including the same include a deep guard ring formed at a photodiode using a deep photodiode isolation process and a deep P well formed around the deep guard ring, thereby achieving the high degree of integration and reducing crosstalk, dark current, and noise.

In addition, a noise blocking area is formed at the deep guard ring, separating an ion implantation layer. As a result, particular major blocks or a pixel block, an analog block, and a digital block may be separated from one another and substrate crosstalk noise is effectively eliminated. Such cell structure preventing crosstalk, dark current, and noise enables a large-capacity image sensor to be manufactured in a small area. Accordingly, more cells can be implemented on a unit area of a semiconductor substrate, thereby realizing a highly-integrated image sensor device. When such device is used in manufacturing a digital system, a high-definition digital product can be obtained.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:
1. A backside illumination image sensor comprising:
an ion implantation layer;
an epitaxial layer disposed at a backside of the ion implantation layer;
a deep guard ring formed in the epitaxial layer to extend to the backside of the ion implantation layer;
a first type well in direct contact with a backside of the deep guard ring;
a second type well in direct contact with the epitaxial layer and disposed alongside the first type well;
a second type deep well formed to directly contact the second type well and side portions of the deep guard ring, and to extend to the backside of the ion implantation layer;
an interlayer wiring and insulation layer disposed on the first type well and the second type well;
a semiconductor substrate bonded to the interlayer wiring and insulation layer; and
a noise blocking area formed at the deep guard ring.

2. The backside illumination image sensor of claim 1, wherein the noise blocking area is formed by forming a shallow trench at the backside of the ion implantation layer.

3. The backside illumination image sensor of claim 1, wherein the noise blocking area is formed by forming the ion implantation layer on the epitaxial layer except for a portion corresponding to the deep guard ring.

4. An image sensing system comprising:
a backside illumination image sensor of claim 1.

* * * * *